US010663535B2

(12) United States Patent
Motz

(10) Patent No.: US 10,663,535 B2
(45) Date of Patent: May 26, 2020

(54) HALL SENSOR WITH INTERLEAVED AND/OR SLIDING AVERAGED/SUMMED SPINNING PHASES

(71) Applicant: Infineon Technologies AG, Neubiberg (DE)

(72) Inventor: Mario Motz, Wernberg (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 16/030,060

(22) Filed: Jul. 9, 2018

(65) Prior Publication Data
US 2020/0011940 A1    Jan. 9, 2020

(51) Int. Cl.
G01R 33/07     (2006.01)
G01R 33/00     (2006.01)

(52) U.S. Cl.
CPC ....... *G01R 33/075* (2013.01); *G01R 33/0094* (2013.01)

(58) Field of Classification Search
None
See application file for complete search history.

(56) References Cited

U.S. PATENT DOCUMENTS

2014/0084912 A1* 3/2014 van Vroonhoven .................. G01R 33/0029
324/251

* cited by examiner

*Primary Examiner* — Jas A Sanghera
(74) *Attorney, Agent, or Firm* — Eschweiler & Potashnik, LLC

(57) ABSTRACT

Various embodiments discussed herein can comprises systems or methods that can improve over existing spinning current Hall sensor systems via at least one of interleaving spinning phases or sliding averaging/summing. One example embodiment can comprise a sensor system comprising M (a positive integer) spinning current Hall sensors, each of which has N (an integer greater than one) distinct spinning phases during which it can acquire sensor data, and a multiplexer that can select sensor data of the sensors according to a M×N spinning phase sensor sequence. The M×N distinct spinning phases of the sensor sequence can be interleaved, wherein the average in the time domain of the N spinning phases for each sensor is the same. For each of the M sensors, a sum and/or an average can be determined for one or more most recent representations of sensor data from that sensor.

23 Claims, 14 Drawing Sheets

4 (=N) interleaved spinning phases for X- Y- and Z-channel (M=3={X,Y,Z}) and sliding average

HALL SENSOR WITH INTERLEAVED AND/OR SLIDING AVERAGED/SUMMED SPINNING PHASES

FIELD

The present disclosure relates to sensor systems, and more specifically to systems and methods for employing spinning current Hall sensors with interleaved spinning phases and/or sliding average(s)/sum(s).

BACKGROUND

A Hall Effect sensor (or Hall sensor) can sense a magnetic field by generating a voltage that varies in response to a magnetic field. However, the accuracy of a Hall sensor can be degraded by offset(s) caused by factors such as asymmetries in the Hall plate bridge of the Hall sensor, mechanical stress, etc. Additional offset can be introduced by an amplifier that amplifies the signal from the Hall sensor. In order to eliminate these offsets, a spinning current technique can be employed, wherein current can be applied to the Hall sensor in different directions (and/or reversing the amplifier and/or ADC (analog-to-digital converter) inputs) during two or more different spinning phases. Sensor signals from different spinning phases can be averaged or summed to eliminate these offsets.

DETAILED DESCRIPTION

Figure 1:
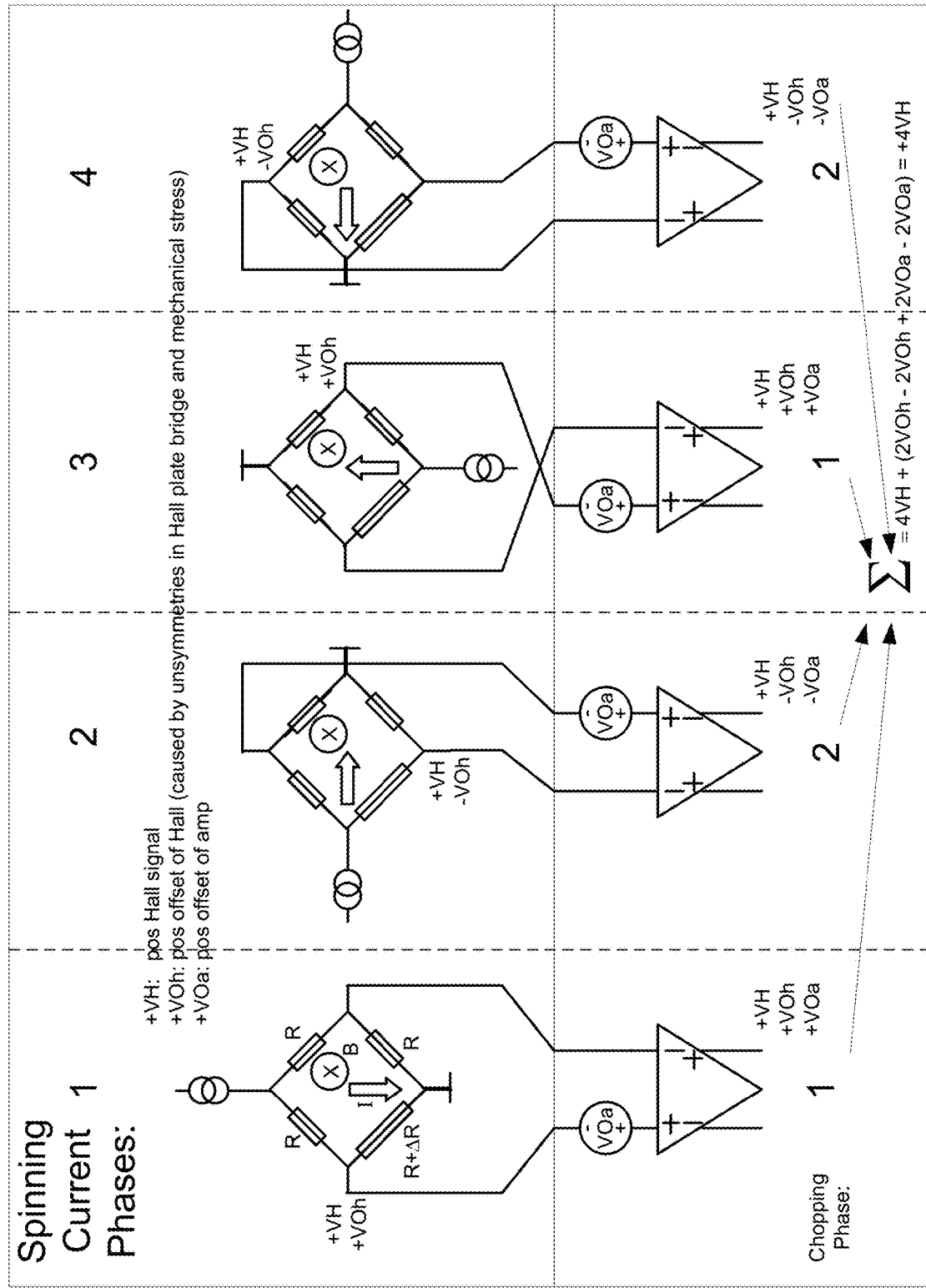
FIG. 1 is a diagram illustrating an example four-phase spinning current Hall sensor with an amplifier, according to various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Embodiments disclosed herein can comprise systems and/or methods of employing spinning current Hall sensors with interleaved spinning phases and/or sliding averaging/summing.

Figure 2:
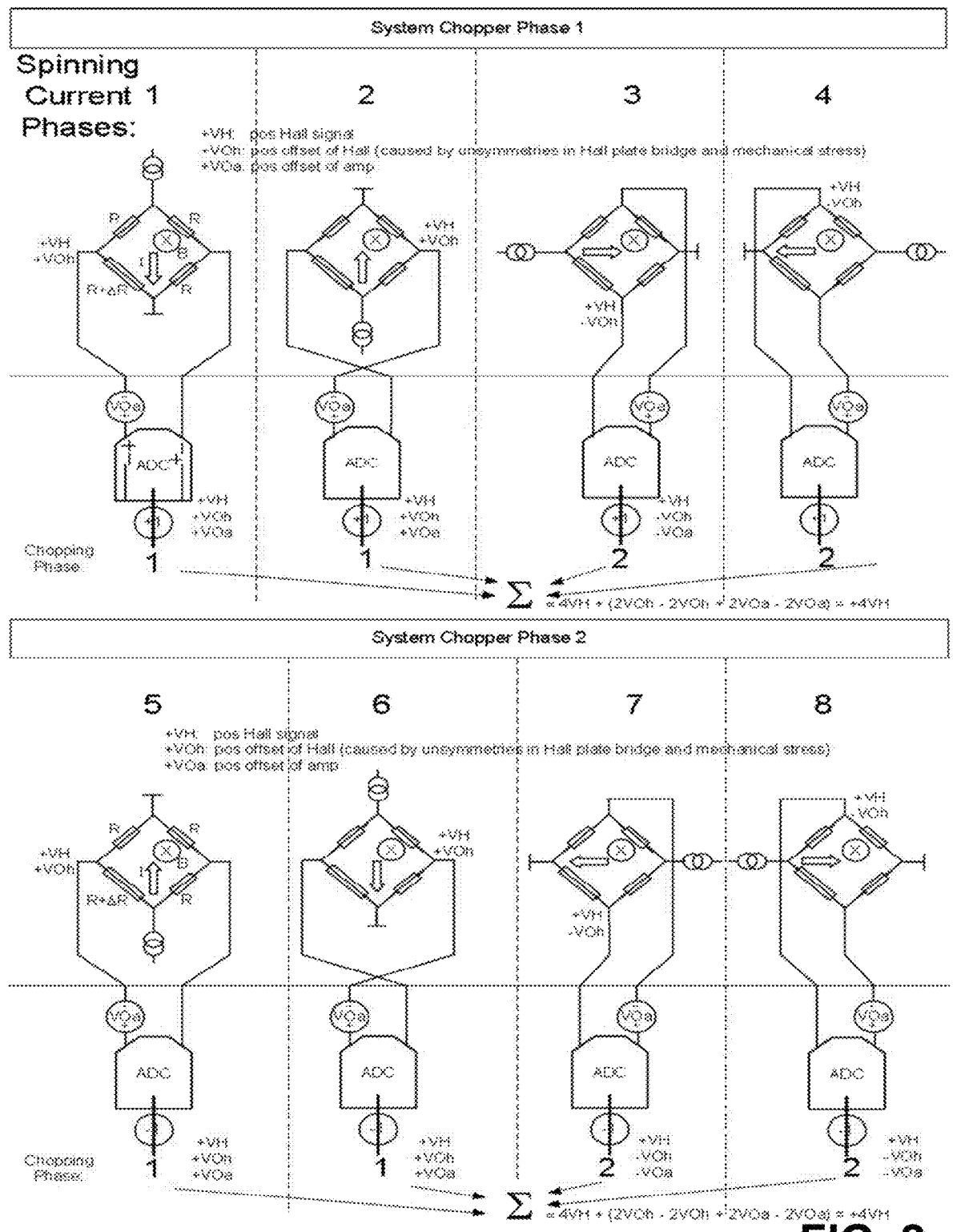
FIG. 2 is a diagram illustrating an example eight-phase spinning current Hall sensor with an ADC (Analog to Digital Converter), according to various aspects described herein.

A spinning current Hall sensor has two or more spinning phases, which can correspond to two or more different current directions across a Hall plate bridge of that sensor (e.g., alone or in combination with varying the polarity of inputs to an amplifier, ADC, etc.). Referring initially to FIG. 1, illustrated is a diagram showing an example four-phase spinning current Hall sensor with an amplifier that can be employed in connection with various aspects discussed herein. Referring to FIG. 2, illustrated is a diagram showing an example eight-phase spinning current Hall sensor with an ADC that can be employed in connection with various aspects discussed herein. In other aspects (not illustrated in FIGS. 1 and 2), other numbers of spinning phases can also be employed, for example, two spinning phases (e.g., with orthogonal current directions to eliminate offset from the Hall sensor), etc. Optionally, in various spinning current Hall sensors discussed herein (e.g., those illustrated in FIGS. 1 and 2 or others), a low pass filter (not shown) can be employed to chop AC (Alternating Current) that may interfere with the sensor signal. As can be seen in FIGS. 1 and 2, summing or averaging different spinning phases from a spinning current Hall sensor can eliminate offsets introduced by a Hall plate bridge (e.g., via asymmetries, mechanical stress, etc.) of the sensor, and/or offsets introduced by other circuit elements such as an amplifier (e.g., operational amplifier (op amp)), Analog to Digital Converter (ADC), etc.

Figures 3A, 3B:
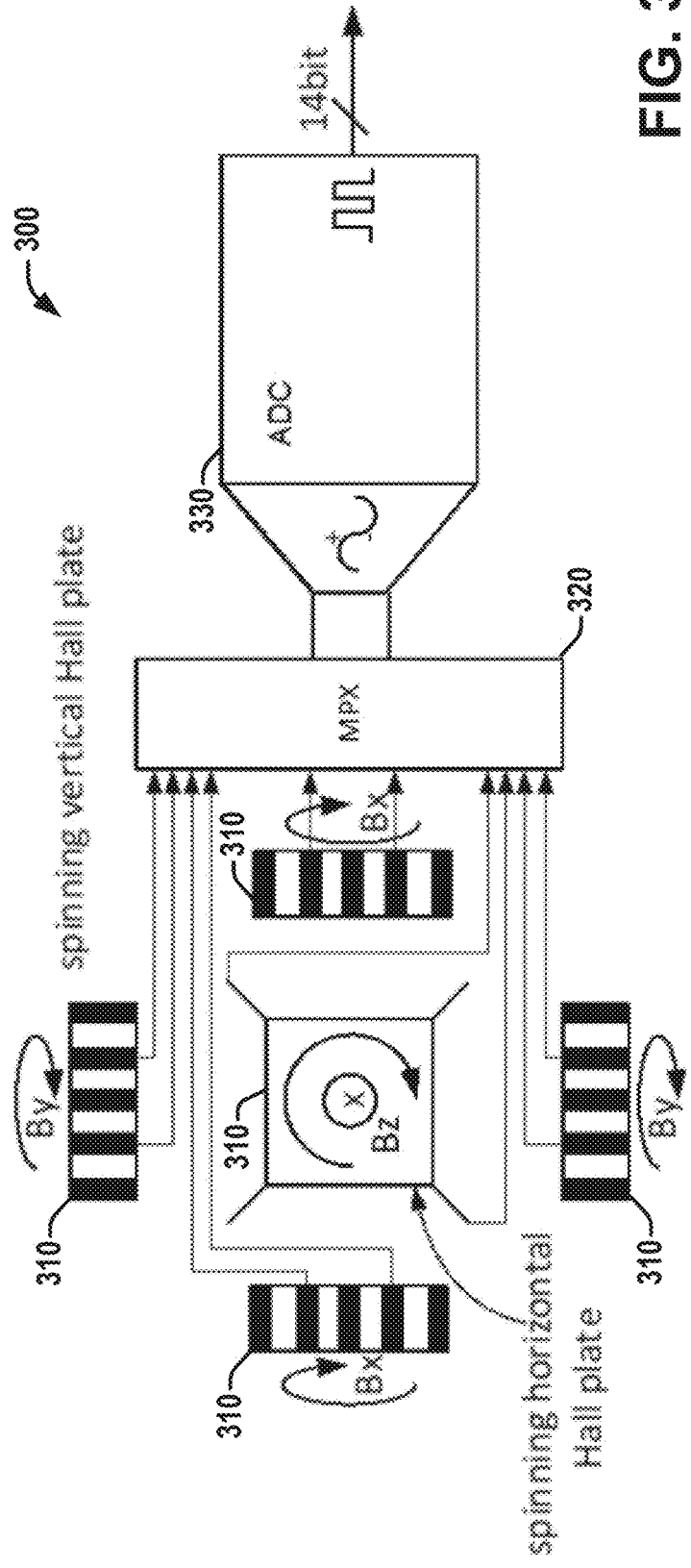
FIG. 3A is a diagram illustrating an example three-dimensional spinning current Hall sensor system that can be employed in connection with various aspects discussed herein.
FIG. 3B is a diagram illustrating an example of an existing sensor sequence with sequential spinning phases and channel multiplexing for spinning current Hall sensors from multiple channels.

Referring to FIG. 3A, illustrated is a diagram showing an example three dimensional spinning current Hall sensor system 300 that can be employed in connection with various aspects discussed herein. The sensor system of FIG. 3A can comprise a plurality of spinning current Hall sensors 310 (as illustrated, in three distinct channels (X-, Y-, and Z-channel)), a multiplexer 320 that multiplexes the outputs of sensors 310 (e.g., an analog representation of sensor data obtained for spinning phase(s) of sensor(s) 310), and ADC (Analog to Digital Converter) 330 that can generate a digital representation of the multiplexed representation(s) of sensor data. In various other examples, sensor systems can comprise fewer channels (e.g., one or two) or more channels (e.g., four or more). In various embodiments, sensor systems discussed herein can be employed in various contexts, such as for sensing position, angular position, etc.

Referring to FIG. 3B, illustrated is a diagram showing an existing sensor sequence with sequential spinning phases and channel multiplexing for spinning current Hall sensors from multiple channels. As can be seen in FIG. 3B, existing multi-channel spinning current Hall sensor systems update each spinning phase of the spinning current Hall sensor for a first channel (e.g., X), followed by updating each spinning phase of the sensor for a second channel (e.g., Y), and continue in this manner for the sensors for each channel, and repeats this sensor sequence. As used herein, a "sensor sequence" can refer to a time-ordered sequence of providing a single update for each distinct phase (e.g., of N phases, with N=4 (1, 2, 3, and 4) in the example of FIG. 3B) of each distinct channel (e.g., of M channels, with M=4 (X, Y, Z, and T) in the example of FIG. 3B) of a sensor system (e.g., a multiplexed sensor system such as that of FIG. 3A or 5). The sensor sequence shown in FIG. 3B is sequential, where spinning phases are ordered in time first by channel, and then by phase. Thus, in the sensor sequence of FIG. 3B, for each channel, each spinning phase of that channel is sequentially arranged (e.g., spinning phase 1 of the X channel is followed by spinning phase 2, which is followed by spinning phase 3, etc.), and the channels are also arranged sequentially (e.g., all of the X channel spinning phases are followed by all of the Y channel spinning phases, etc.). Each spinning phase of the sensor sequence can have the same duration (e.g., 12.5 µs in the example of FIG. 3B), giving an update rate of that duration multiplied by the number of spinning phases per channel (e.g., of 4×12.5 µs=50 µs in FIG. 3B), and a delay between channels that is a multiple of that update rate that depends on the order in which channels are updated (e.g., 50 µs between X and Y, 100 µs between X and Z).

Figure 4:
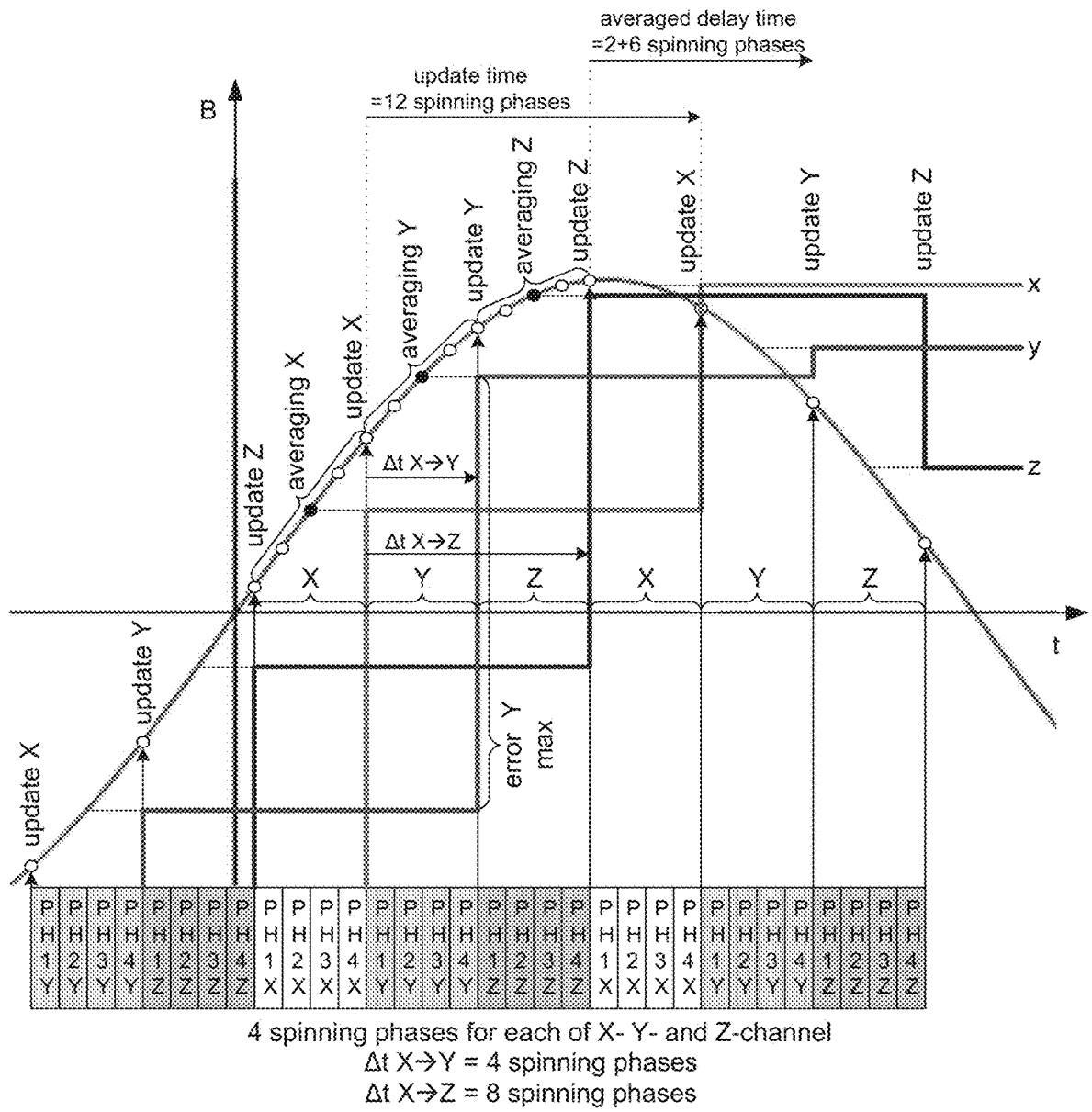
FIG. 4 is a diagram illustrating the existing sensor sequence of FIG. 3B in connection with an example magnetic field, along with the delays, update times, and amplitude errors for three multiplexed channels.

Existing sensor systems employ sequential sequences such as the example shown in FIG. 3B, which, although sufficient for some purposes (e.g., with relatively slower varying magnetic fields or relatively lower accuracy requirements), also have multiple drawbacks. Referring to FIG. 4, illustrated is a diagram showing the existing sensor sequence of FIG. 3B in connection with an example magnetic field, along with the delays, update times, and amplitude errors for three multiplexed channels. As can be seen in FIG. 4, existing techniques can lead to a high delay of all channels, a high delay between channels (which can lead to high position, angle, or phase errors in multidimensional (e.g., 2D, 3D, etc.) sensors, especially with rapidly changing input signals), different delays between channels, and high jitter (uncertainty in the time domain).

In contrast to existing techniques, embodiments discussed herein can employ one or more of interleaved spinning phases and/or sliding averaging/summing, which can provide multiple advantages over existing techniques, such as reduced delay of all channels, reduced or eliminated delay between channels, reduced or eliminated jitter, and time synchronized sensor data between channels (e.g., averaged or summed sensor data that has the same effective time for each channel).

Figure 5:
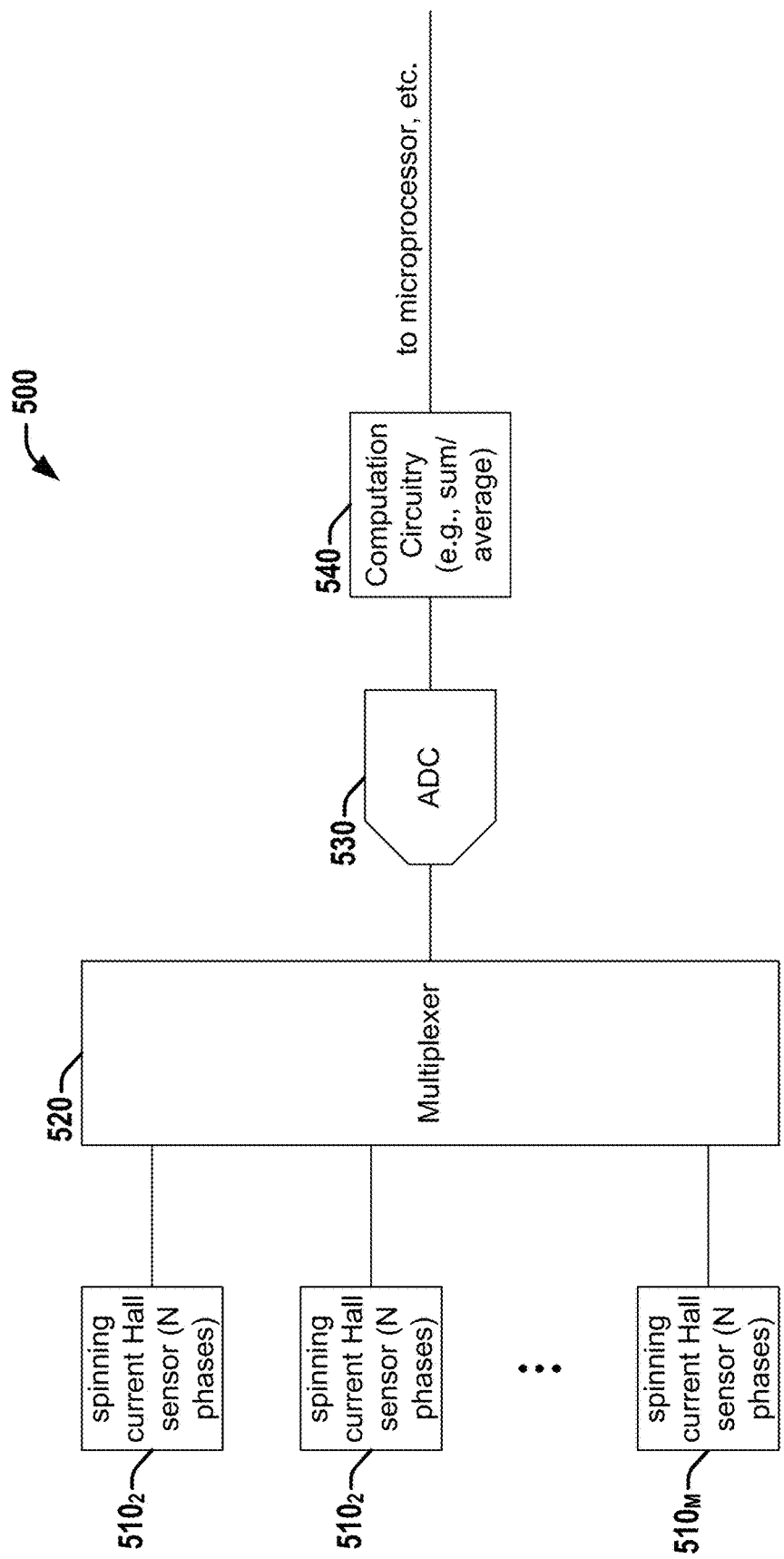
FIG. 5 is a block diagram illustrating an example sensor system that can facilitate interleaving of spinning phases between multiplexed channels and/or sliding averaging/summing of spinning phases, according to various aspects discussed herein.

Referring to FIG. 5, illustrated is a block diagram of an example sensor system 500 that can facilitate interleaving of spinning phases between multiplexed channels and/or sliding averaging/summing of spinning phases, according to various aspects discussed herein. System 500 can comprise M (where M is an integer greater than or equal to 1, e.g., 1, 2, 3, etc.) spinning current Hall sensors $510_i$ (with M>1 in embodiments employing interleaving of spinning phases), a multiplexer 520, one or more ADC(s) (Analog to Digital Converter(s)) 530, and computation circuitry 540.

Each spinning current Hall sensor $510_i$ can acquire, during each spinning phase of N spinning phases for that sensor $510_i$ (where N is an even integer greater than 1, e.g., 2, 4, 8, etc.), associated sensor data for that spinning phase of that sensor $510_i$. During a time instance at or near the end of each spinning phase of those N spinning phases, that sensor $510_i$ can make available or generate a representation of the acquired sensor data for that spinning phase. In various embodiments, the acquired sensor data for each spinning phase of each sensor $510_i$ can be amplified via an amplifier (not shown) associated with that sensor $510_i$, such as an operation amplifier. In various embodiments, the M×N spinning phases of the M sensors $510_i$ can be arranged in a specific order in time, according to a sensor sequence associated with that embodiment (e.g., an interleaved sensor sequence, etc.), which repeats.

Multiplexer 520 can be coupled to each of the M sensors $510_i$ and can select and output, at each time instance of the sensor sequence (e.g., interleaved, etc.), the representation of associated sensor data from the spinning phase associated with that time instance in the sensor sequence.

System 500 can also comprise one or more ADCs 530, which can receive the (analog) representations of sensor data (e.g., when coupled to multiplexer 520 as shown in FIG. 5, or with an associated ADC coupled between each sensor $510_i$ and multiplexer 520), and generate digital representation(s) thereof (e.g., to output to computation circuitry 540).

Computation circuitry 540 can be coupled to ADC 530 and can receive the digital representation(s) of associated sensor data (or if each sensor $510_i$ has an associated ADC 530, computation circuitry 540 can receive sensor data from multiplexer 520). Based on the received representations of associated sensor data, computation circuitry 540 can determine, for each of the M sensors $510_i$, a sum and/or an average (e.g., weighted average, etc.) of one or more most recent representations of sensor data from that sensor $510_i$ (e.g., the N most recent representations, the N/2 most recent representations, etc.). In some aspects (e.g., wherein the one or more most recent representations is fewer than the N most recent representations, etc.), computation circuitry 540 can adjust the determined sum or average based on one or more other representations of sensor data for that sensor $510_i$ (e.g., via adding or subtracting half of the difference between two selected representations). Depending on the embodiment, computation circuitry 540 can determine, for each of the M sensors $510_i$, the sum and/or the average after each sensor sequence (e.g., every M×N spinning phases), or more frequently in embodiments employing sliding averaging/summing (e.g., every N spinning phases, or every spinning phase from that sensor $510_i$). In various embodiments, computation circuitry 540 can comprise circuitry capable of calculating the sum and/or average. In various embodiments wherein computation circuitry 540 determines a sum and/or average based on digital representation(s) of sensor data, computation circuitry 540 can comprise hardware (e.g., adders, processing circuitry (e.g., processor, ASIC, etc.)) alone or in combination with software configured to determine the sum/average (alternatively, in relevant embodiments, computation circuitry 540 can comprise hardware configured to determine the sum/average of analog representation(s) of sensor data).

In various aspects, the output of system 500 (e.g., from computation circuitry 540, etc.) can be provided to an external microprocessor, for example, via a serial interface (e.g., in a sequential manner, etc.).

In various embodiments, an interleaved sensor sequence can be employed as the sensor sequence by a sensor system (e.g., sensor system 500). An interleaved sensor sequence can have spinning phases ordered in time by spinning phase before any ordering based on channel. Thus, in an interleaved sensor sequence, the first spinning phase of each channel can be updated before the second spinning phase of any channel is updated (and the second spinning phase of each channel can be updated before the third spinning phase of any channel is updated if there are 3 or more spinning phases per channel (or before the first spinning phase of each channel is re-updated if there are not 3 or more spinning phases per channel), etc.). In contrast, a sequential sensor sequence such as the existing sensor sequence of FIG. 3B has spinning phases ordered in time by channel first and spinning phase second. Thus, in a sequential sensor sequence, each spinning phase of a first channel (e.g., X-channel) is updated before any spinning phase of a second channel (e.g., Y-channel) is updated (and each spinning phase of the second channel is updated before any spinning phase of the third channel is updated if there are 3 or more channels (or before any spinning phase of the first channel is re-updated if there are not 3 or more channels), etc.).

As an example, in a sensor system with M sensors that each have N spinning phases, an interleaved sensor sequence can comprise M×N spinning phases arranged as N consecutive groups of M spinning phases, wherein the first group of M spinning phases of the sensor sequence are a first spinning phase for each of the M sensors, the second group of M spinning phases of the sensor sequence are a second spinning phase for each of the M sensors, etc. In contrast, in a similar system, a sequential sensor sequence can comprise M×N spinning phases wherein the first N spinning phases of the sensor sequence are the N spinning phases of a first sensor, the second N spinning phases of the sensor sequence are the N spinning phases of a second sensor, etc.

In contrast to existing sensor sequences, interleaved sensor sequences discussed herein (e.g., M×N spinning phases arranged as N consecutive groups of M spinning phases) can have the spinning phases for each channel ordered such that, in each sensor sequence, the average in the time domain for the spinning phases of each channel are the same, thus the averaged/summed sensor data for each channel is associated with a single point in time (e.g., the averaged/summed sensor data for each channel has the same time stamp). In various embodiments, the spinning phases for each channel can be arranged such that the average time for each channel is a center time for the sensor sequence. As one example, the same average time can be obtained by reversing the ordering of channels in consecutive groups of M spinning phases. For example, in a 3-channel (e.g., X-, Y-, and Z-channels) sensor system with 4 spinning phases per channel, if a sensor sequence begins with a group of 3 spinning phases comprising the first phase of each channel in a first order (e.g., 1 (denoting the first phase of the X channel), Y1, Z1), the next group of 3 spinning phases can comprise the second phase of each channel in the reverse order (e.g., Z2, Y2, X2), which can reverse again for the third phase (e.g., X3, Y3, Z3), and reverse again for the fourth phase (e.g., Z4, Y4, X4).

Figure 6:
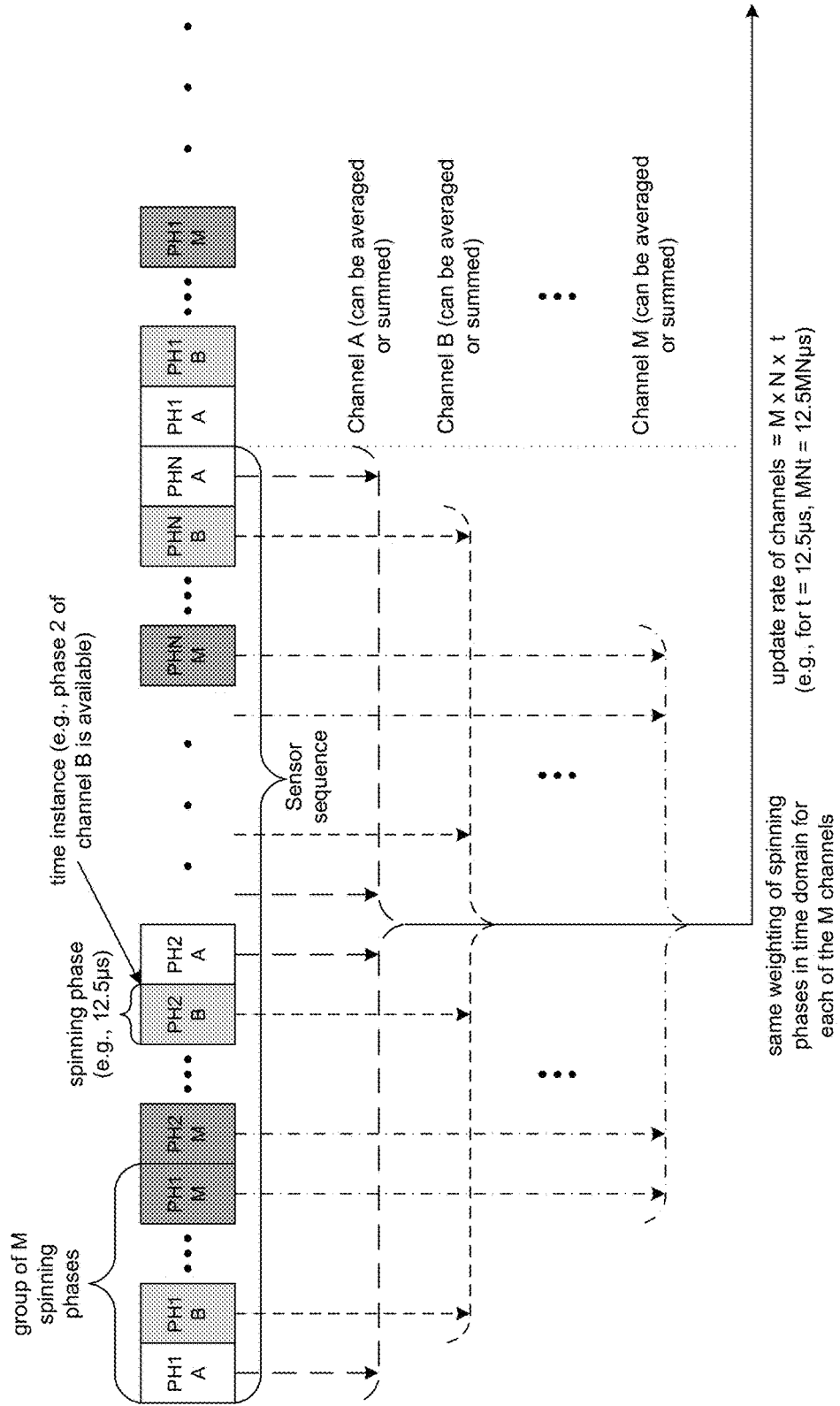
FIG. 6 is a diagram illustrating an example interleaved sensor sequence employable by a spinning current Hall sensor system comprising M channels with N spinning phases per channel, according to various aspects discussed herein.
Figure 7:
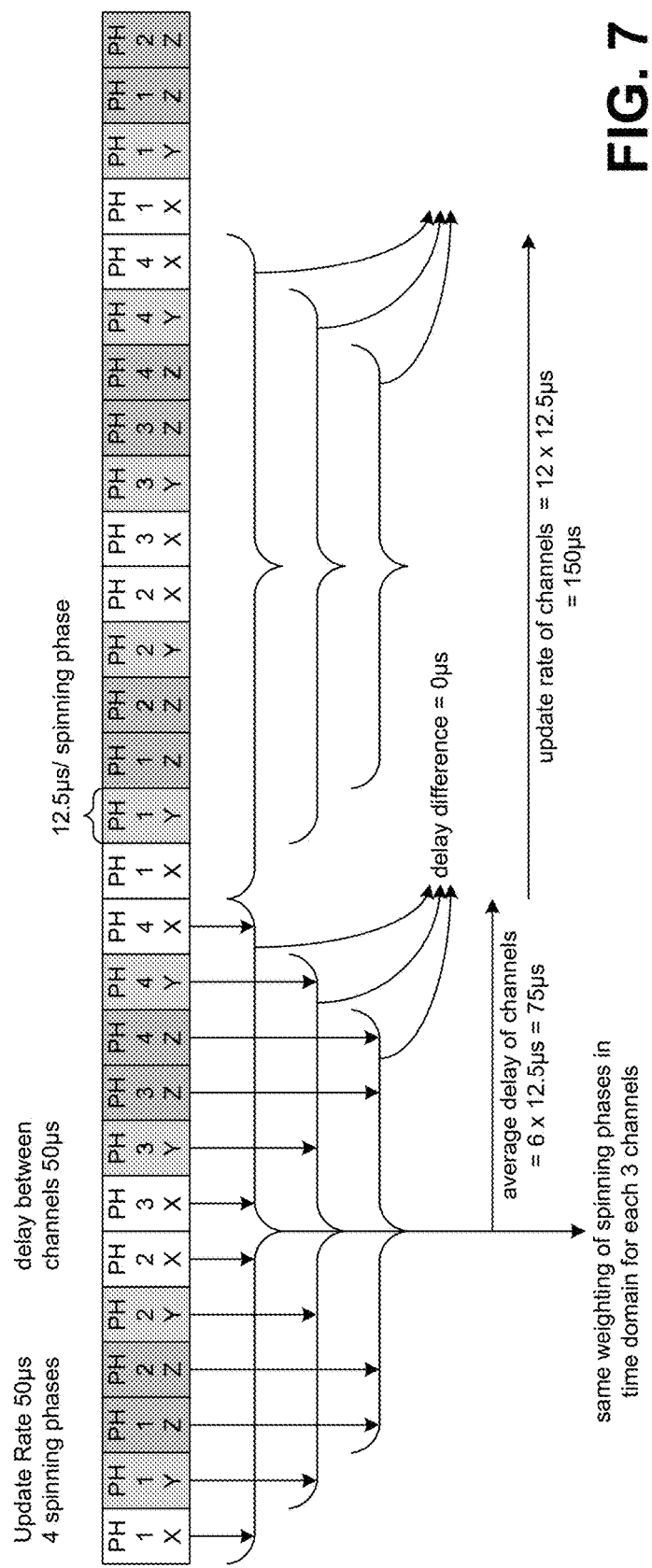
FIG. 7 is a diagram illustrating an example interleaved sensor sequence employable by a spinning current Hall sensor system comprising 3 channels with 4 spinning phases per channel, according to various aspects discussed herein.

Referring to FIG. 6, illustrated is a diagram showing an example interleaved sensor sequence employable by a spinning current Hall sensor system comprising M channels with N spinning phases per channel, according to various aspects discussed herein. In FIG. 6, the M×N spinning phases of the sensor sequence are arranged in N consecutive groups of M spinning phases comprising a single spinning phase from each of the M channels, where the first group of M spinning phases has a first ordering (e.g., A1 through M1) and each consecutive group of M spinning phases has an ordering that is the reverse of the immediately preceding group of M spinning phases (e.g., the second group has M2 through A2, the third group (if N>2) has A3 through M3, etc.). As can be seen in FIG. 6, such an ordering can guarantee the same average in the time domain in the sensor sequence for each of the M channels, which can substantially reduce error (e.g., angle error, phase error) relative to existing techniques. Referring to FIG. 7, illustrated is a diagram showing an example interleaved sensor sequence employable by a spinning current Hall sensor system comprising 3 channels with 4 spinning phases per channel, according to various aspects discussed herein. As with the example interleaved sequence of FIG. 6, FIG. 7 has the same average in the time domain for each channel in each sensor sequence. In the example of FIG. 7, with a 12.5 μs duration per spinning phase, the channels can have an average delay of 75 μs (equal to the average of the delays shown in FIG. 3B, but with less uncertainty), and no delay difference between the channels. If the sensor data is summed or averaged at the end of each sensor sequence, the channels can have an update rate of 150 μs (however, in various aspects, sliding averaging/summing techniques discussed herein can be employed to substantially reduce the update rate).

As can be seen from FIGS. 6 and 7, embodiments discussed herein can provide sensor data with the same average in the time domain for each channel of a multi-channel sensor system, in contrast to existing sensor sequences. Using an existing sensor sequence, such as that shown in FIG. 3B, provides sensor data for different channels at different points in time, with sensor data for a first channel (e.g., X-channel) at one point in time, sensor data for a second channel (e.g., Y-channel) at a second point in time (e.g., 50 μs later than the X-channel), and sensor data for a third channel (e.g., Z-channel) at a third point in time (e.g., 50 μs later than the Y-channel and 100 μs later than the X-channel). Thus, with existing techniques, there is no single point in time in which sensor data for each of the channels is available. In contrast, employing interleaved techniques discussed herein can provide more accurate output than from existing techniques, and complete sensor data for each of the channels for specific points in time. The interleaved techniques discussed herein can eliminate delay variation between channels and jitter, thus reducing error in multi-channel sensor systems.

Figure 8:
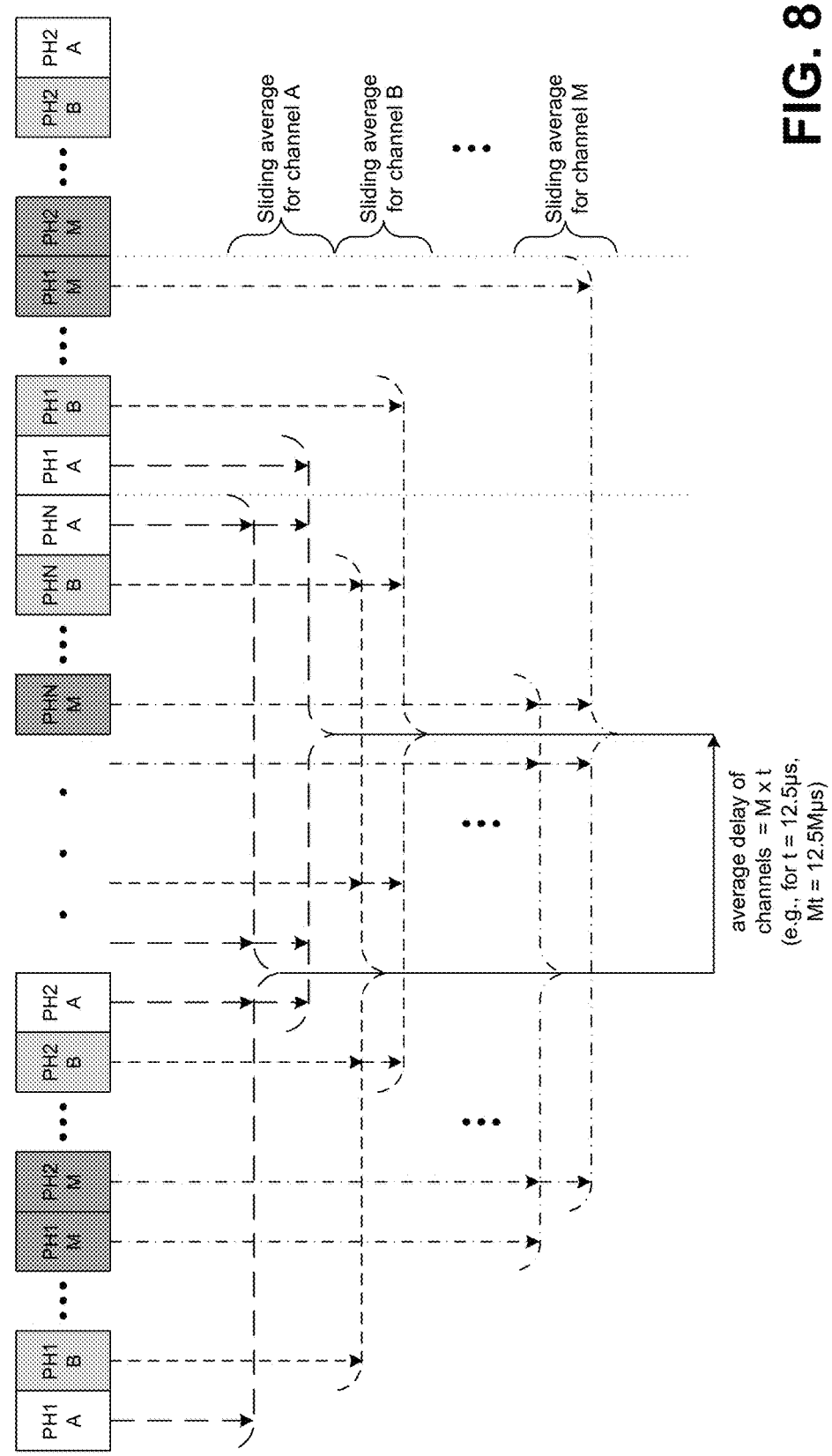
FIG. 8 is a diagram illustrating an example sensor sequence that facilitates sliding averaging or summing in an interleaved spinning current Hall sensor system comprising M channels with N spinning phases per channel, according to various aspects discussed herein.
Figure 9:
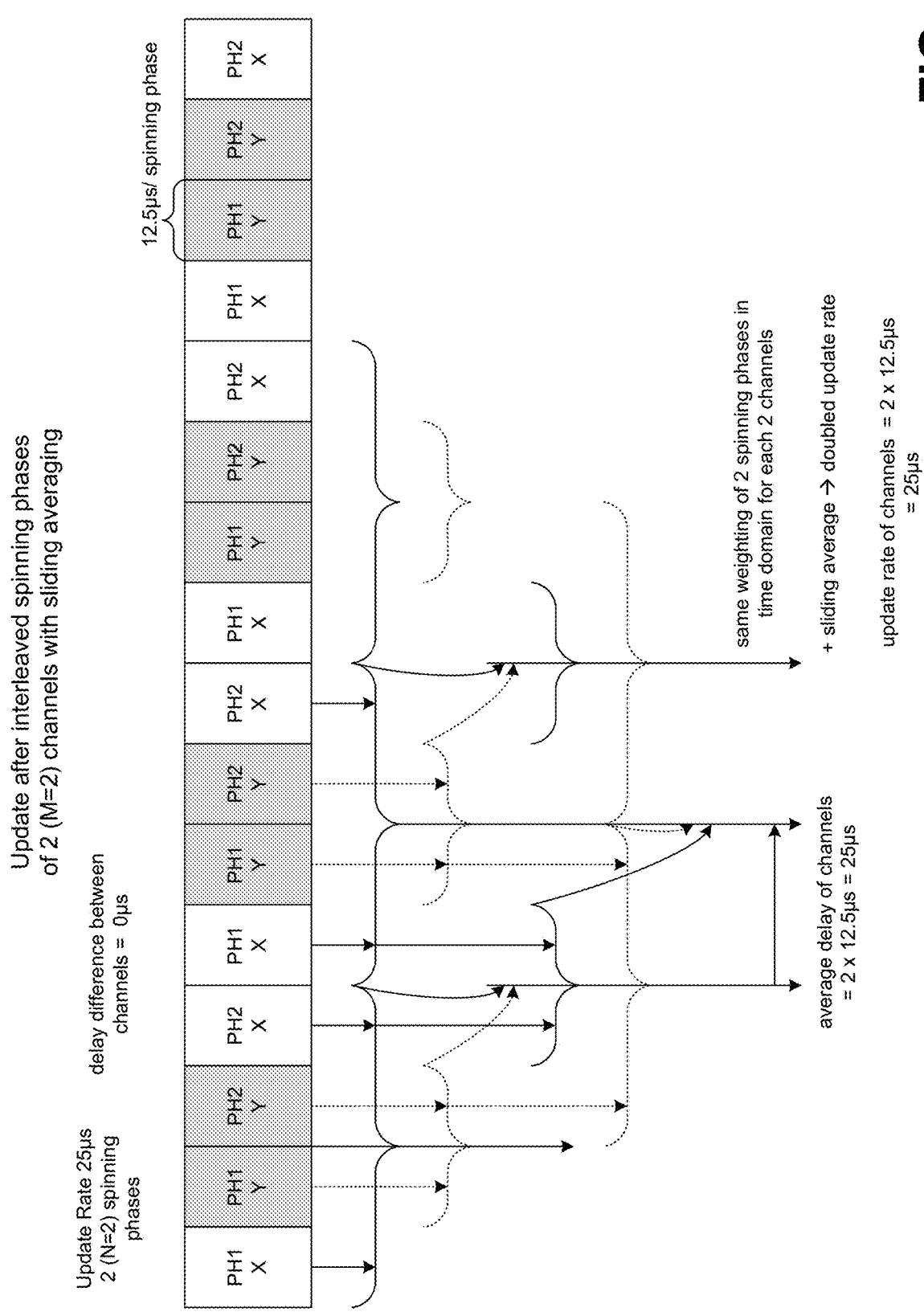
FIG. 9 is a diagram illustrating an example sensor sequence that facilitates sliding averaging or summing in an interleaved spinning current Hall sensor system comprising 2 channels with 2 spinning phases per channel, according to various aspects discussed herein.

In various embodiments, sliding averaging or summing techniques can be applied in addition to interleaving techniques. Referring to FIG. 8, illustrated is a diagram showing an example sensor sequence that facilitates sliding averaging or summing in an interleaved spinning current Hall sensor system comprising M channels with N spinning phases per channel, according to various aspects discussed herein. Referring to FIG. 9, illustrated is a diagram showing an example sensor sequence that facilitates sliding averaging or summing in an interleaved spinning current Hall sensor system comprising 2 channels with 2 spinning phases per channel, according to various aspects discussed herein.

As can be seen in FIGS. 8 and 9 (e.g., compared with FIGS. 6-7), similar sensor sequences can be employed for both sliding averaging/summing and interleaving. With the interleaved sensor sequences discussed herein (e.g., comprising M×N spinning phases arranged as N consecutive groups of M spinning phases, etc.), at the end of each sensor sequence, the average in the time domain of the N spinning phases for each of the M channels is the same. However, as can be seen in FIGS. 6-9, the average in the time domain of the most recent N spinning phases of a channel is also the same for each of the M channels after each group of M spinning phases (where that group comprises a single spinning phase from each channel, and consecutive groups have reversed orderings). Thus, in various aspects, a sum or average of the most recent N spinning phases of a channel can be determined (e.g., via computation circuitry 540) for that channel more frequently than after every sensor sequence, such as after every group of M spinning phases, or after every spinning phase for that channel.

Using sliding averaging or summing techniques shown in FIGS. 8 and 9 can significantly reduce the update rate of channels in a multi-channel spinning current Hall sensor system. As can be seen by comparing FIG. 6 with FIG. 8, without sliding averaging or summing the update rate of each channel is M×N×t (where t is the duration of a single spinning phase (e.g., 12.5 μs)), which can be reduced by a factor of N to M×t by employing sliding averaging or summing.

Figure 10:
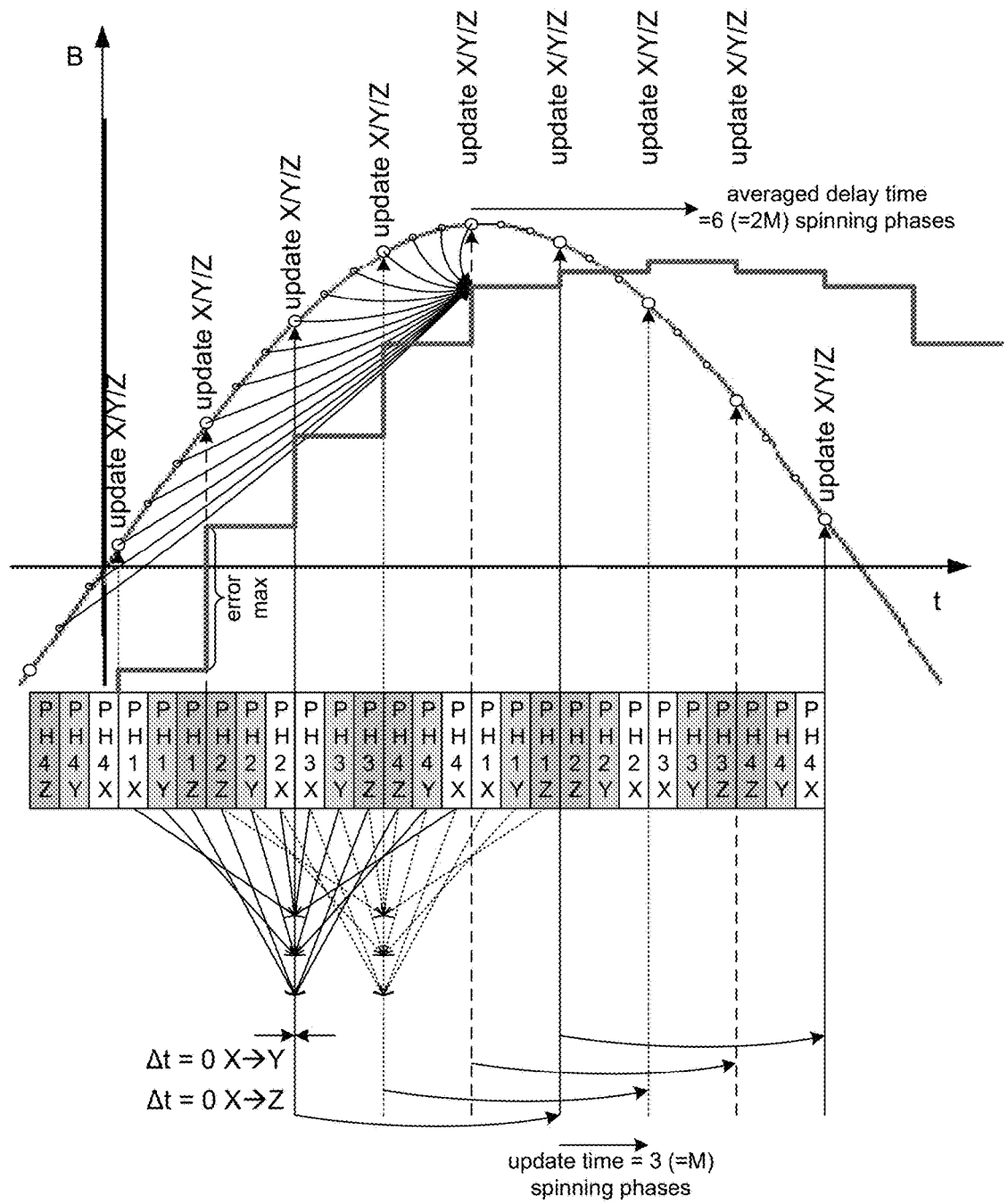
FIG. 10 is a diagram illustrating an interleaved sensor sequence with sliding averaging as discussed herein, in connection with an example magnetic field, along with the delays, update times, and amplitude errors for three multiplexed channels.

Referring to FIG. 10, illustrated is a diagram showing an interleaved sensor sequence with sliding averaging as discussed herein, in connection with an example magnetic field, along with the delays, update times, and amplitude errors for three multiplexed channels. In various aspects discussed herein, determining a sliding average or sum can comprise determining (or re-determining) an average or sum of the one or more (e.g., N, N/2, etc.) most recent spinning phases of a channel regardless of whether the most recent spinning phase is the last spinning phase of a sensor sequence.

Embodiments employing interleaving and/or sliding averaging/summing as discussed herein can improve significantly over existing techniques. Interleaving of spinning phases (such as with the example sensor sequences of FIGS. 6-10) can reduce the constant delay differences between channels seen in existing techniques to significantly smaller or zero difference. Additionally employing sliding averaging or sliding summing can reduce jitter, increase update rates for channels, and increase the speed and bandwidth of channels. As can be seen by comparing FIG. 10 with FIG. 4, embodiments discussed herein can provide sensor data that is significantly more accurate than with existing techniques, has a higher update rate, and has the same average time between channels at each update.

Figure 11:
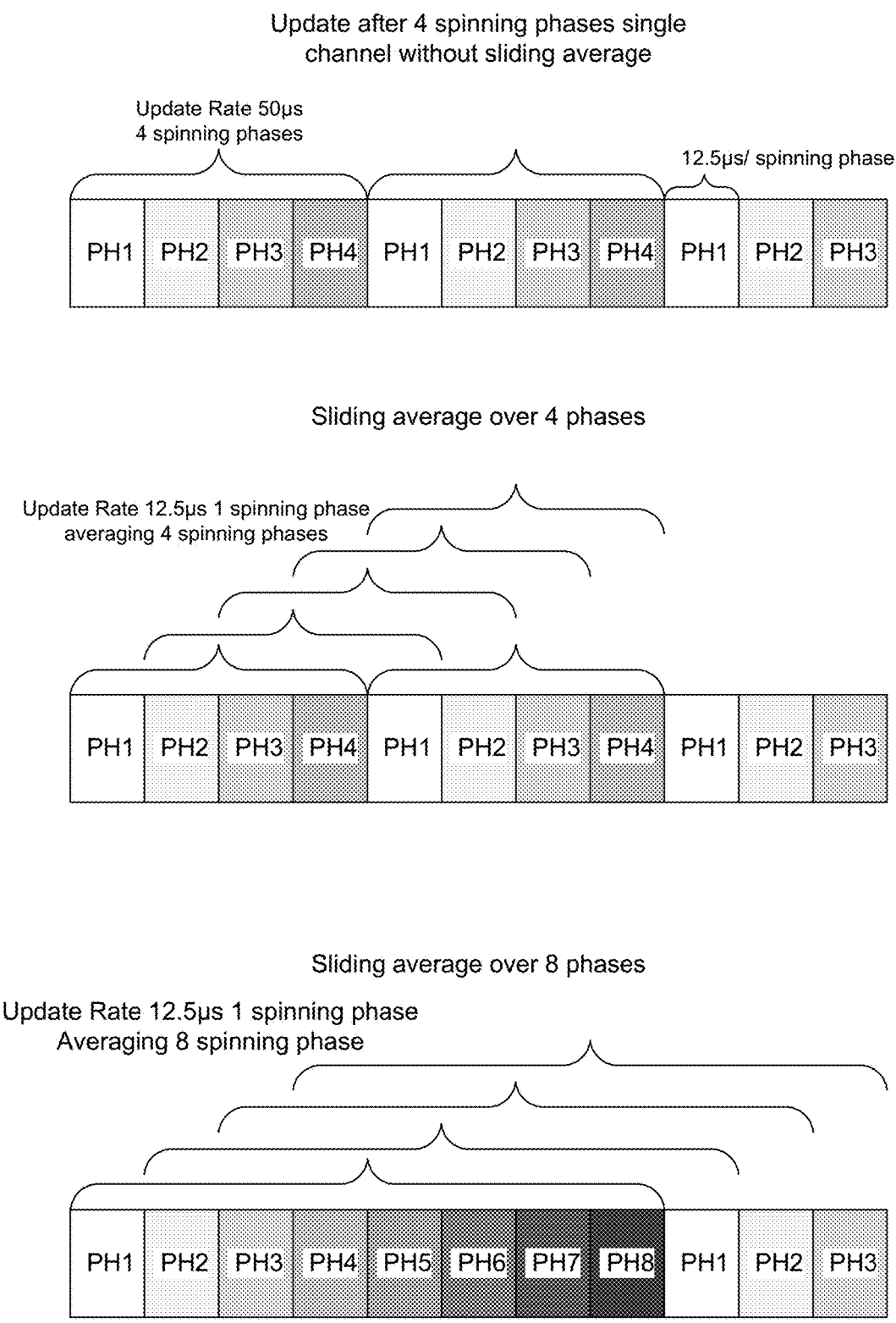
FIG. 11 is a diagram illustrating a comparison in terms of update rates between a 4 spinning phase channel without sliding averaging/summing (top), a 4 spinning phase channel with sliding averaging/summing (center), and an 8 spinning phase channel with sliding averaging/summing (bottom), in connection with various aspects discussed herein.

Referring to FIG. 11, illustrated is a diagram showing a comparison in terms of update rates between a 4 spinning phase channel without sliding averaging/summing (top), a 4 spinning phase channel with sliding averaging/summing (center), and an 8 spinning phase channel with sliding averaging/summing (bottom), in connection with various aspects discussed herein. As can be seen in FIG. 11, sliding averaging/summing can significantly reduce the update rate for a spinning current Hall sensor. In some embodiments, a sensor system can comprise a single spinning current Hall sensor, and a sliding sum or average can be determined for sensor data from that sensor.

Figure 12:
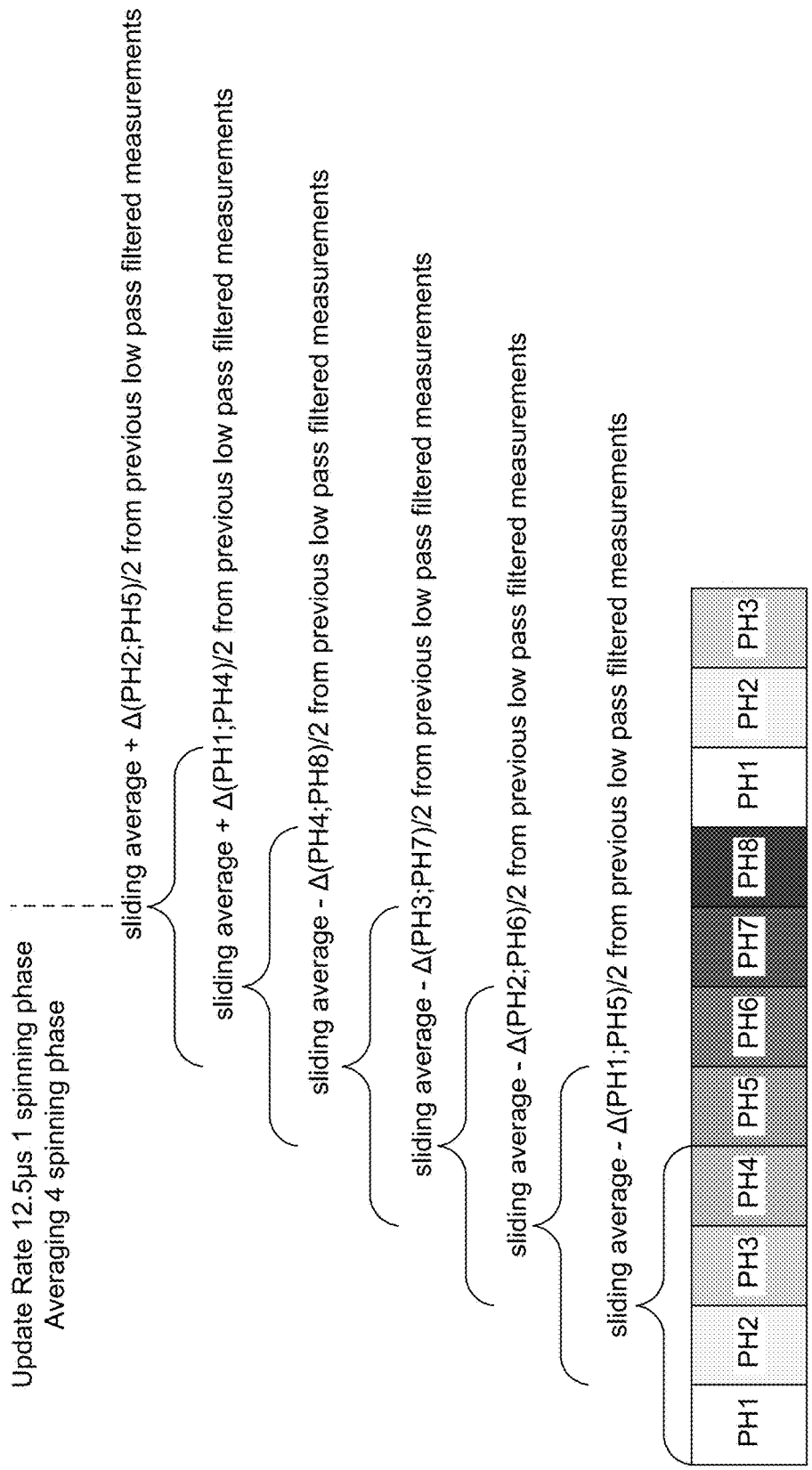
FIG. 12 is a diagram illustrating sliding averaging of a most recent 4 spinning phases in an 8 spinning phase channel, according to various aspects discussed herein.

In FIGS. 8-11, sliding averaging/summing is shown over a most recent N spinning phases for each channel. However, as can be seen in FIGS. 6-9, the average in the time domain of the most recent 2k (for k any positive integer) spinning phases of a channel is also the same for each of the M channels after each group of M spinning phases (where that group comprises a single spinning phase from each channel, and consecutive groups have reversed orderings). Thus, in various embodiments, sliding averaging/summing can be employed based on fewer than N spinning phases for a channel. However, because each of the spinning phases of a spinning current Hall sensor can be (in general) affected by different offset(s) (e.g., due to the Hall sensor itself and/or other coupled circuitry), a sliding sum or average of fewer than N spinning phases for a channel can include one or more offsets that are not canceled in the sum or average by other spinning phases. Thus, in various embodiments, to eliminate the offset(s), such a sum or average (e.g., of less than the N most recent spinning phases for a channel) can be adjusted by adding or subtracting a term to eliminate the offset(s) (e.g., a linear combination of one or more other spinning phases of that channel, such as half of a difference between two other spinning phases of that channel). Referring to FIG. 12, illustrated is a diagram showing sliding averaging of a most recent 4 spinning phases in an 8 spinning phase channel, according to various aspects discussed herein. As can be seen in FIG. 12, the sliding average of the most recent 4 spinning phases can be adjusted by adding or subtracting half of the difference of two other spinning phases to eliminate offset(s). The two other spinning phases, and whether to add or subtract, can be determined based on the uncanceled offset(s) that would otherwise remain after the most recent 4 spinning phases are averaged/summed.

Figure 13:
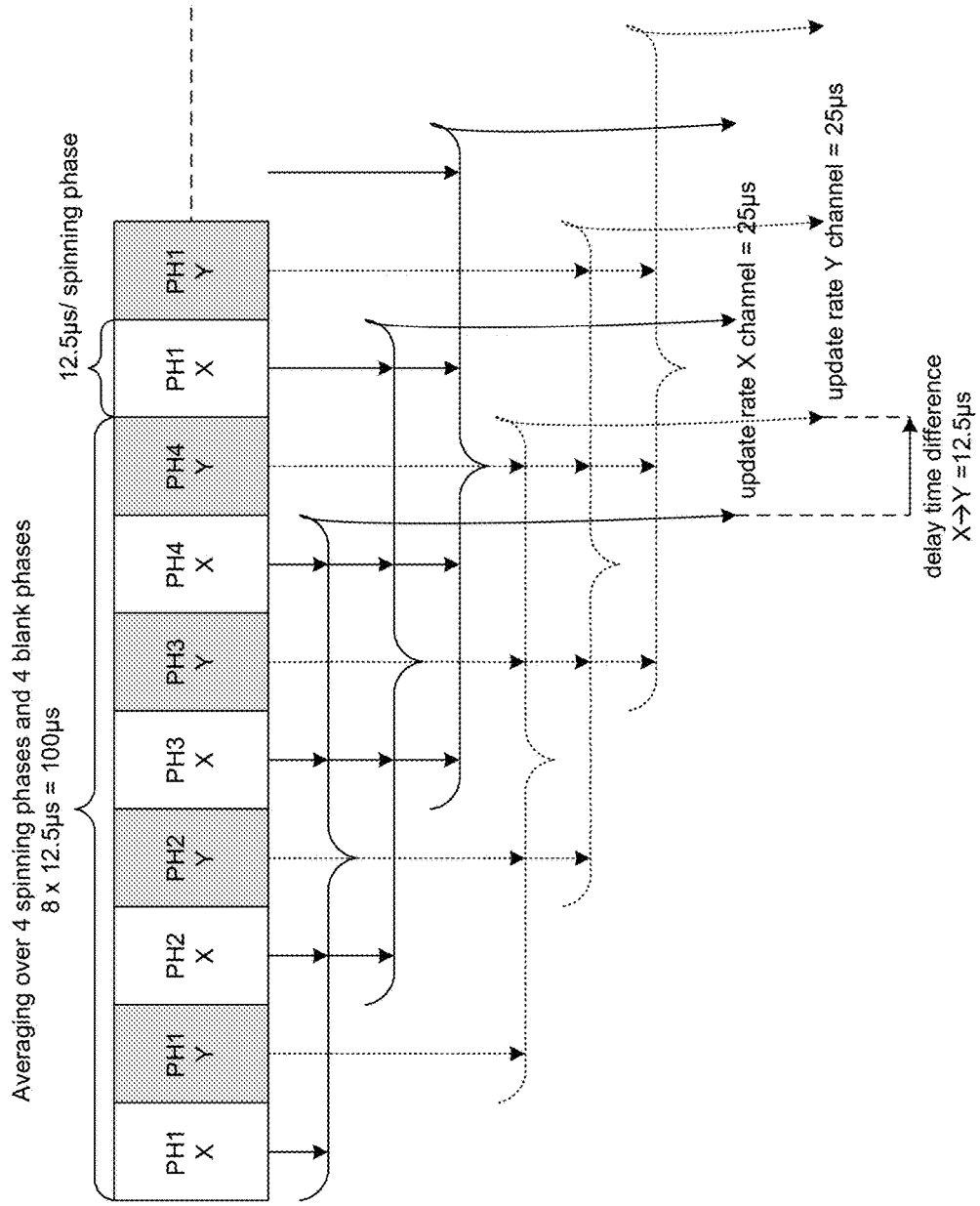
FIG. 13 is a diagram illustrating sliding averaging of spinning phases for 2 channels with 4 spinning phases per channel, according to various aspects discussed herein.

Additionally, in some embodiments, a sliding average/sum can be determined based on other sensor sequences than the interleaved sensor sequences of FIGS. 6-10. Referring to FIG. 13, illustrated is a diagram showing sliding averaging of spinning phases for 2 channels with 4 spinning phases per channel, according to various aspects discussed herein. As can be seen in FIG. 13, the update rate of each of the channels is 25 µs (2 (=M)×12.5 µs (=t)), which is a factor of 4 (=N) faster than updating each channel once per sensor sequence, as in existing techniques.

Figure 14:
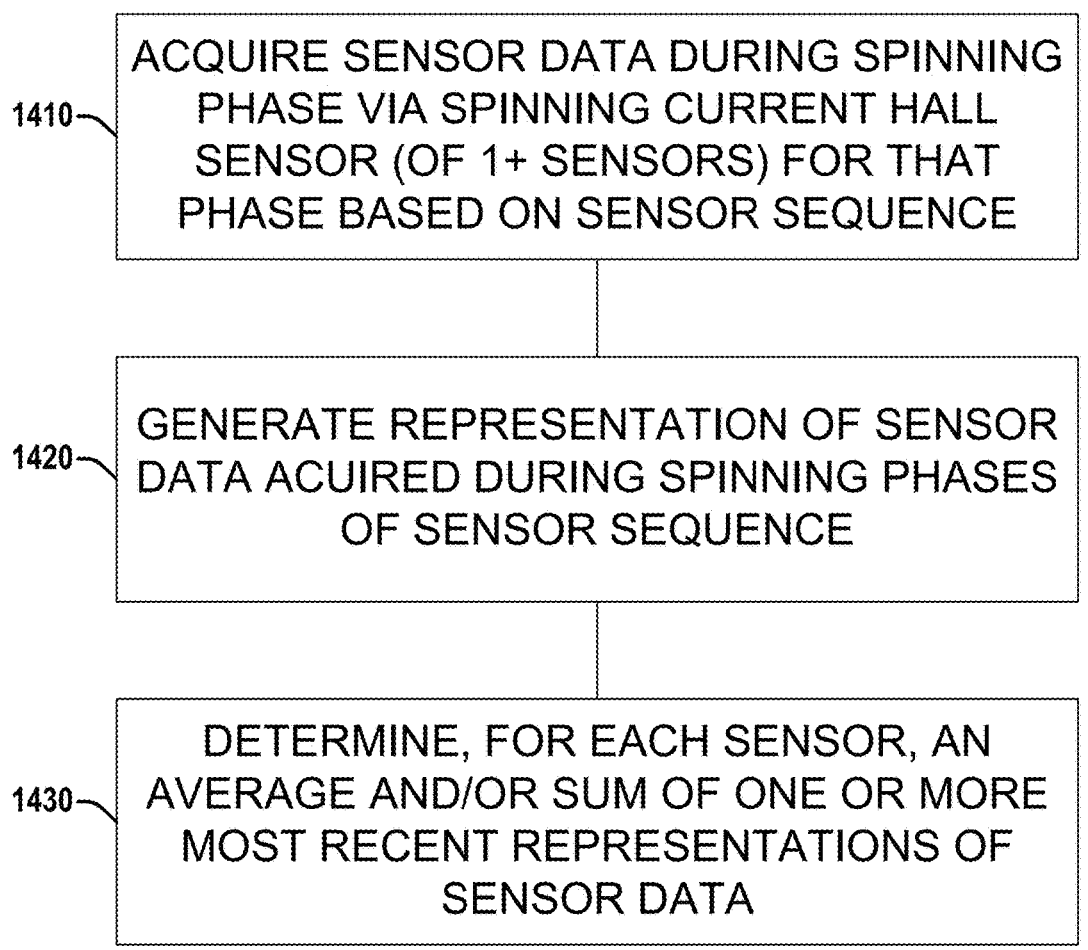
FIG. 14 is a flow diagram illustrating a method that facilitates generation of sensor data based on an interleaved sensor sequence and/or sliding summing or averaging of sensor data, according to various aspects discussed herein.

Referring to FIG. 14, illustrated is a flow diagram of a method 1400 that facilitates generation of sensor data based on an interleaved sensor sequence and/or sliding summing or averaging of sensor data, according to various aspects discussed herein. Depending on the specific embodiment, method 1400 can facilitate interleaving of spinning phases and/or sliding averaging/summing.

At 1410, during each spinning phase of each sensor sequence of a plurality of sensor sequences, respective sensor data can be acquired for that spinning phase via a spinning current Hall sensor (of one or more sensors) associated with that spinning phase, and can repeat over one or more sensor sequences. The sensor sequence can comprise spinning phases of the sensors ordered by spinning phase. For example, for M sensors with N spinning phases each, the sensor sequence comprises M×N spinning phases that are N consecutive groups of M spinning phases, with each group comprising a single spinning phase from each sensor. In embodiments employing interleaving of spinning phases, consecutive groups of M spinning phases can have reversed ordering (e.g., if a first group comprises a first spinning phase of each sensor according to a first ordering, e.g., (A1, B1, . . . M1), then a second group can comprise a second spinning phase of each sensor according to the reverse of the first ordering, e.g., (M1, L1, . . . A1), which can reverse again to the first ordering for the next group (e.g., a third group or the first group again), etc.).

At 1420, at a time instance at or near the end of each spinning phase of the sensor sequence, a representation of the sensor data acquired for that spinning phase can be generated (e.g., an analog representation and/or a digital representation).

At 1430, for each spinning current Hall sensor, a respective average value or sum can be determined of the representations of the associated sensor data for one or more (e.g., N, N/2, etc.) most recent spinning phases of that spinning current Hall sensor. In interleaved embodiments that do not employ sliding averaging/summing, the sum or average can be determined for each sensor once per sensor sequence based on the spinning phases from that sensor during that sensor sequence (e.g., at the end of the sensor sequence, after the final spinning phase from that sensor of the sensor sequence, etc.). Alternatively, in embodiments employing sliding averaging/summing, the sum or average can be re-determined for each sensor for each spinning phase from that sensor based on the one or more most recent spinning phases from that sensor.

Additionally or alternatively, method 1400 can include one or more other acts or features described herein in connection with various embodiments of one or more sensor systems or sensor sequences discussed herein.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system according to embodiments and examples described herein.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. An apparatus, comprising:
M spinning current Hall sensors, wherein M is an integer greater than one, wherein, in each sensor sequence of one or more sensor sequences, each spinning current Hall sensor of the M spinning current Hall sensors is configured to:
   acquire, during each spinning phase of N spinning phases of that spinning current Hall sensor, associated sensor data for that spinning phase of that spinning current Hall sensor, wherein N is an even integer greater than one; and
   generate, for each spinning phase of the N spinning phases of that spinning current Hall sensor, a representation of the associated sensor data at an associated time instance of that sensor sequence, wherein the associated time instance corresponds to an end of that spinning phase,
   wherein that sensor sequence comprises M×N spinning phases, wherein the M×N spinning phases comprise the N spinning phases for each spinning current Hall sensor of the M spinning current Hall sensors; and
a multiplexer configured to receive signals from the M spinning current Hall sensors and to output, at each associated time instance of the M×N spinning phases of each sensor sequence, the representation of the associated sensor data associated with the spinning phase associated with that time instance,
wherein, for each spinning current Hall sensor of the M spinning current Hall sensors, an average of the respective time instances for the N spinning phases of that spinning current Hall sensor in each sensor sequence of the one or more sensor sequences is a common average time instance for that sensor sequence for each spinning current Hall sensor of the M spinning current Hall sensors.

2. The apparatus of claim 1, further comprising computation circuitry configured to:
   receive, during each spinning phase of the M×N spinning phases of each sensor sequence, the representation of the associated sensor data associated with that spinning phase; and
   in response to receiving each sensor sequence, determine, for each spinning current Hall sensor, one of: a respective sum of the representations of the associated sensor data for one or more most recent spinning phases of that spinning current Hall sensor, or a respective average value of the representations of the associated sensor data for the one or more most recent spinning phases of that spinning current Hall sensor.

3. The apparatus of claim 2, wherein, for each spinning current Hall sensor, the one or more most recent spinning phases is the N most recent spinning phases.

4. The apparatus of claim 2, wherein the M×N spinning phases of each sensor sequence is N consecutive groups of M spinning phases, wherein each spinning phase of each group of M spinning phases is associated with a different spinning current Hall sensor of the M spinning current Hall sensors than other spinning phases of that group of M spinning phases.

5. The apparatus of claim 4, wherein the computation circuitry is further configured to, in response to receiving each spinning phase, one of:
   re-determine the respective sum as a sum of the representations of the associated sensor data for the one or more most recent spinning phases of the spinning current Hall sensor associated with that spinning phase; or
   re-determine the respective average value as an average of the representations of the associated sensor data for the one or more most recent spinning phases of the spinning current Hall sensor associated with that spinning phase.

6. The apparatus of claim 4, wherein N is eight, and wherein, for each spinning current Hall sensor, the one or more most recent spinning phases is the N/2 most recent spinning phases.

7. The apparatus of claim 6, wherein, for each spinning current Hall sensor, the computation circuitry is further configured to:
   select two representations of the associated sensor data other than the N/2 most recent representations; and
   one of:
   adjust the respective sum by one of adding or subtracting half of the difference between the two selected representations to the respective sum; or
   adjust the respective average by one of adding or subtracting half of the difference between the two selected representations to the respective average.

8. The apparatus of claim 1, wherein M is one of two or three.

9. The apparatus of claim 1, wherein N is one of two, four, or eight.

10. An apparatus, comprising:
M spinning current Hall sensors, wherein M is an integer greater than one, wherein, in each sensor sequence of one or more sensor sequences, each spinning current Hall sensor of the M spinning current Hall sensors is configured to:
   acquire, during each spinning phase of N spinning phases of that spinning current Hall sensor, associated sensor data for that spinning phase of that spinning current Hall sensor, wherein N is an even integer greater than one; and
   generate, for each spinning phase of the N spinning phases of that spinning current Hall sensor, a representation of the associated sensor data at an associated time instance of that sensor sequence, wherein the associated time instance corresponds to an end of that spinning phase,
   wherein that sensor sequence comprises M×N spinning phases in N consecutive groups of M spinning phases, wherein each spinning phase of each group of M spinning phases is associated with a different spinning current Hall sensor of the M spinning current Hall sensors than other spinning phases of that group of M spinning phases;
a multiplexer configured to receive signals from the M spinning current Hall sensors and to output, at each associated time instance of the M×N spinning phases of each sensor sequence, the representation of the associated sensor data associated with the spinning phase associated with that time instance; and computation circuitry configured to:
receive, during each spinning phase of the M×N spinning phases of each sensor sequence, the representation of the associated sensor data associated with that spinning phase; and
determine, for each spinning current Hall sensor, in response to each group of M spinning phases, one of: a respective sum of the representations of the associated sensor data for one or more most recent spinning phases of that spinning current Hall sensor, or a respective average value of the representations of the associated sensor data for the one or more most recent spinning phases of that spinning current Hall sensor.

11. The apparatus of claim 10, wherein, for each sensor sequence of the one or more sensor sequences, the N groups of M spinning phases comprise N/2 consecutive pairs of groups of spinning phases, wherein each pair of groups of spinning phases comprises a first group of M spinning phases followed by a second group of M spinning phases, wherein the first group of M spinning phases has a first ordering of the M spinning current Hall sensors associated with the M spinning phases of the first group of M spinning phases, wherein the second group of M spinning phases has a second ordering of the M spinning current Hall sensors associated with the M spinning phases of the second group of M spinning phases, and wherein the first ordering is the reverse of the second ordering.

12. The apparatus of claim 10, wherein, for each spinning current Hall sensor of the M spinning current Hall sensors, an average of the respective time instances for the N spinning phases of that spinning current Hall sensor in each sensor sequence of the one or more sensor sequences is a common average time instance for that sensor sequence for each spinning current Hall sensor of the M spinning current Hall sensors.

13. The apparatus of claim 10, wherein, for each spinning current Hall sensor of the M spinning current Hall sensors, an average of the respective time instances for the N spinning phases of that spinning current Hall sensor in a most recent N consecutive groups of M spinning phases of the one or more sensor sequences is a common average time instance for each spinning current Hall sensor of the M spinning current Hall sensors.

14. The apparatus of claim 10, wherein M is one of two or three.

15. The apparatus of claim 10, wherein N is one of two, four, or eight.

16. The apparatus of claim 10, wherein, for each spinning current Hall sensor, the one or more most recent spinning phases is the N most recent spinning phases.

17. A method, comprising:
acquiring, during each spinning phase of each sensor sequence of a plurality of sensor sequences, respective sensor data for that spinning phase, wherein that spinning phase is one of N spinning phases of a respective spinning current Hall sensor of M spinning current Hall sensors, wherein each sensor sequence comprises M×N spinning phases, wherein for each sensor sequence that respective spinning phase of that respective spinning current Hall sensor is uniquely associated with a respective position in that sensor sequence, and wherein M is an integer greater than one and N is an even integer greater than one; and
generating, at a respective time instance corresponding to an end of each spinning phase of each sensor sequence, the acquired respective sensor data acquired for that spinning phase,
wherein, for each spinning current Hall sensor of the M spinning current Hall sensors, an average of the respective time instances for the N spinning phases of that spinning current Hall sensor in each sensor sequence of the one or more sensor sequences is a common average time instance for that sensor sequence for each spinning current Hall sensor of the M spinning current Hall sensors.

18. The method of claim 17, further comprising determining, for each spinning current Hall sensor and for each sensor sequence, a respective average value of the representations of the associated sensor data for one or more most recent spinning phases of that spinning current Hall sensor.

19. The method of claim 18, further comprising re-determining, in response to outputting each spinning phase, the respective average value of the representations of the associated sensor data for one or more most recent spinning phases of the spinning current Hall sensor associated with that spinning phase, as an average of the one or more most recent representations of the associated sensor data associated with that spinning current Hall sensor.

20. The method of claim 18, wherein, for each spinning current Hall sensor, the one or more most recent spinning phases is the N most recent spinning phases.

21. The method of claim 17, wherein the M×N spinning phases of each sensor sequence is N consecutive groups of M spinning phases, wherein each spinning phase of each group of M spinning phases is associated with a different spinning current Hall sensor of the M spinning current Hall sensors than other spinning phases of that group of M spinning phases.

22. The method of claim 17, wherein M is one of two or three.

23. The method of claim 17, wherein N is one of two, four, or eight.

* * * * *